US010168754B2

(12) United States Patent
Okada (10) Patent No.: US 10,168,754 B2
(45) Date of Patent: Jan. 1, 2019

(54) POWER CONDITIONER

(71) Applicant: Murata Manufacturing Co., Ltd., Nagaokakyo-shi, Kyoto-fu (JP)

(72) Inventor: Masanobu Okada, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/590,412

(22) Filed: May 9, 2017

(65) Prior Publication Data

US 2017/0242464 A1    Aug. 24, 2017

Related U.S. Application Data

(63) Continuation of application No. PCT/JP2015/074330, filed on Aug. 28, 2015.

(30) Foreign Application Priority Data

Nov. 11, 2014 (JP) ................. 2014-228749

(51) Int. Cl.
*G06F 1/26* (2006.01)
*H01L 23/367* (2006.01)
(Continued)

(52) U.S. Cl.
CPC ............ *G06F 1/26* (2013.01); *H01L 23/3675* (2013.01); *H02J 3/18* (2013.01); *H02M 3/33569* (2013.01);
(Continued)

(58) Field of Classification Search
CPC .. H05K 7/0201; H05K 7/0205; H05K 7/0209; H05K 7/2089; H05K 7/20409; G06F 1/26; H02S 40/42
(Continued)

(56) References Cited

U.S. PATENT DOCUMENTS 5,267,122 A * 11/1993 Glover ................. G02B 6/3897
174/50.51
5,940,272 A     8/1999 Emori et al.
6,362,594 B2 *  3/2002 Kajiura ............... B60L 11/1825
320/104

FOREIGN PATENT DOCUMENTS

JP      H10-51912 A    2/1998
JP      H11-122949 A   4/1999
(Continued)

OTHER PUBLICATIONS

International Search Report issued in International Application No. PCT/JP2015/074330, dated Nov. 17, 2015.
(Continued)

*Primary Examiner* — Mukund G Patel
(74) *Attorney, Agent, or Firm* — Arent Fox LLP (57) ABSTRACT

A power conditioner is provided that includes a heat dissipating member, multiple circuit boards, and a mounting auxiliary plate. A power conditioner circuit including an electric heat generating element is formed on each of the circuit boards. The circuit boards are mounted on a front surface of the heat dissipating member. Heat dissipating fins are arranged on a back surface of the heat dissipating member. Preferably, the heat dissipating member is formed from a material having high heat dissipation property. The mounting auxiliary plate is fixed to the back surface side of the heat dissipating member and provided with a through hole for mounting to a wall. The mounting auxiliary plate has higher rigidity than the heat dissipating member.

17 Claims, 8 Drawing Sheets

(51) Int. Cl.
  *H02J 3/18* (2006.01)
  *H02M 3/335* (2006.01)
  *H02M 5/45* (2006.01)
  *H05K 7/20* (2006.01)
  *H02M 7/00* (2006.01)
(52) U.S. Cl.
  CPC .......... *H02M 5/4505* (2013.01); *H05K 7/205* (2013.01); *H05K 7/20409* (2013.01); *H02M 7/003* (2013.01)
(58) Field of Classification Search
  USPC .................................................. 361/719, 711
  See application file for complete search history.

(56) References Cited

FOREIGN PATENT DOCUMENTS

| | | |
|---|---|---|
| JP | 2008-103576 A | 5/2008 |
| JP | 2008-259282 A | 10/2008 |
| JP | 2012-170183 A | 9/2012 |
| JP | 2012-244770 A | 12/2012 |

OTHER PUBLICATIONS

Written Opinion of the International Searching Authority issued in International Application No. PCT/JP2015/074330, dated Nov. 17, 2015.

* cited by examiner

PRIOR ART

POWER CONDITIONER

CROSS REFERENCE TO RELATED APPLICATIONS

The present application is a continuation of PCT/JP2015/074330 filed Aug. 28, 2015, which claims priority to Japanese Patent Application No. 2014-228749, filed Nov. 11, 2014, the entire contents of each of which are incorporated herein by reference.

TECHNICAL FIELD

The present disclosure relates to a power conditioner that can be attached to a wall of a house or the like.

BACKGROUND

Currently, photovoltaic power generation and fuel cell power generation have been adopted in many ordinary households. Photovoltaic power generation and fuel cell power generation employ DC power systems. On the other hand, commercial power employs AC power systems.

Therefore, a household in which photovoltaic power generation or fuel cell power generation and commercial power are used needs to be equipped with a power conditioner that connects a DC power system to an AC power system. The power conditioner has, for example, a shape like the power collection box disclosed in Patent Document 1 (identified below), and can be installed on a wall of a house.

In the power collection box disclosed in Patent Document 1, a plurality of heat dissipating fins and a mounting jig are disposed on a back surface of a housing. The mounting jig is disposed at each of both ends of the housing in the lateral direction. The plurality of heat dissipating fins are arranged between the two mounting jigs so as to be spaced apart from each other at predetermined intervals.

Figure 8:
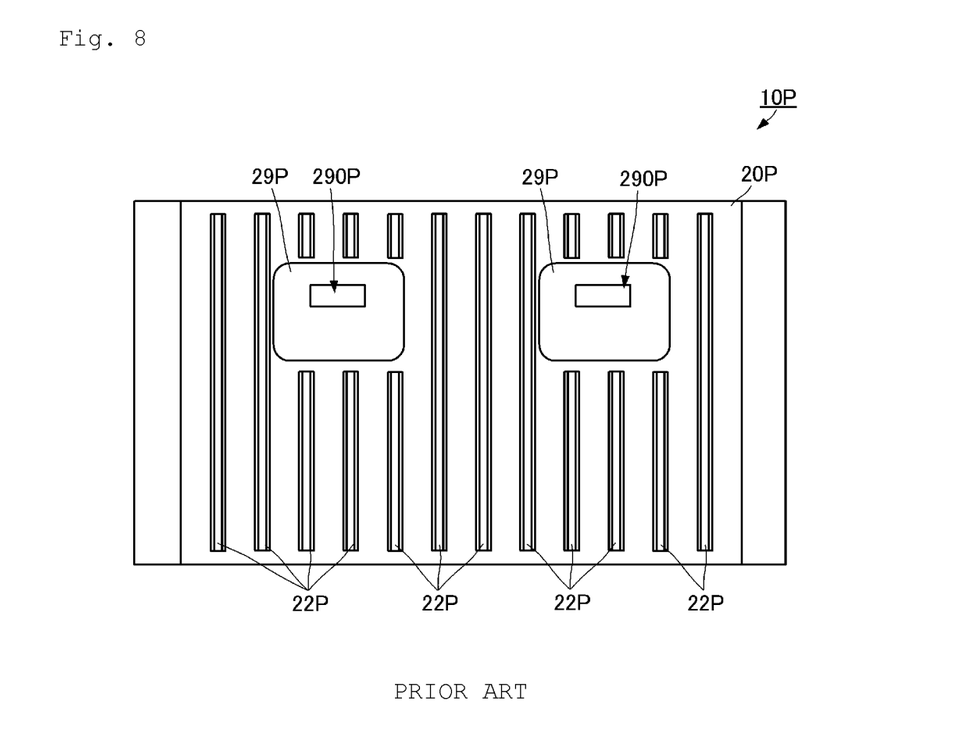
FIG. 8 is a plan view showing a shape of a back surface side of a conventional power conditioner.

In addition, for one existing power conditioner, a configuration is used in which the power conditioner is mounted on a wall as shown in FIG. 8. FIG. 8 is a plan view showing a shape of a back surface side of the existing power conditioner.

As shown, a plurality of heat dissipating fins 22P are disposed on a back surface of a heat dissipating member 20P of the existing power conditioner 10P. The plurality of heat dissipating fins 22P have a long shape. The plurality of heat dissipating fins 22P are disposed such that the longitudinal direction thereof is parallel to the vertical direction of the power conditioner 10P. The plurality of heat dissipating fins 22P are disposed over substantially the entire surface except leg portions disposed at both ends of the power conditioner 10P in the lateral direction. Projections 29P are further disposed on the back surface of the heat dissipating member 20P. Each projection 29P is provided with a hook-shaped hole 290P.

To install and fix the power conditioner 10P to a wall, mounting hook members will generally be provided on the wall and fitted to the hook-shaped holes 290P.

Patent Document 1: Japanese Unexamined Patent Application Publication No. 2012-244770.

Typically, the power conditioner or the power collection box is heavy in most cases. Therefore, with the configuration disclosed in Patent Document 1, the power collection box will drop from the wall unless each mounting jig is made large and strong to a certain extent or higher. Thus, each mounting jig requires a large area on the back surface of the power collection box. Therefore, the area for the heat dissipating fins becomes small, so that it is not possible to improve the heat dissipation efficiency.

In addition, also in the structure shown in FIG. 8, the mounting hook members provided on the wall and the hook-shaped holes 290P to which the mounting hook members are fitted have to be increased in size for bearing the weight of the power conditioner 10P. Therefore, the projections 29P in which the hook-shaped holes 290P are provided also become large in size, so that the proportion of the projections 29P to the back surface of the heat dissipating member 20P becomes high. When the projections 29P become large in size as described, the area in which the heat dissipating fins can be disposed decreases, so that it is not possible to improve the heat dissipation efficiency.

SUMMARY

It is an object of the present disclosure to provide a power conditioner that can be assuredly and firmly mounted on a wall and has favorable heat dissipation efficiency.

As disclosed herein, a power conditioner includes a circuit board on which a power conditioner circuit including an electric heat generating element is formed; a heat dissipating member having a front surface on which the circuit board is mounted and having a back surface on which a plurality of heat dissipating fins are arranged; and a mounting auxiliary plate fixed to a back surface side of the heat dissipating member. Moreover, the mounting auxiliary plate can be provided with a hole for mounting to a wall and has a higher rigidity than the rigidity of the heat dissipating member.

In this configuration, the hole for mounting to the wall is not directly formed in the back surface of the heat dissipating member. Thus, it is possible to increase the area where the heat dissipating fins are arranged. In addition, since the hole for mounting is formed in the mounting auxiliary plate having higher rigidity than the heat dissipating member, the power conditioner achieves the required strength even with a small size and a small thickness as compared to the case where the hole is directly formed in the heat dissipating member. Therefore, it is possible to assuredly and firmly mount the power conditioner on the wall without increasing the size of the power conditioner.

In addition, the power conditioner disclosed herein is preferably configured, such that the plurality of heat dissipating fins have a long shape extending in a first direction in plan view of the back surface of the heat dissipating member and are arranged so as to be spaced apart from each other in a second direction orthogonal to the first direction. Moreover, the heat dissipating member includes leg portions at both ends in a direction of the arrangement of the plurality of heat dissipating fins. The mounting auxiliary plate is fixed to each of the leg portions at a plurality of locations. As a result, a void is defined between the heat dissipating fins and the mounting auxiliary plate.

In this configuration, since heat is not transmitted from the heat dissipating fins directly to the mounting auxiliary plate, the power conditioner can inhibit heat transmission from the mounting auxiliary plate to the wall. Thus, it is possible to reduce damage to the wall surface due to use over a long period of time. In this case, since the mounting auxiliary plate is fixed to each of the leg portions of the heat dissipating member at a plurality of locations, even when the heat dissipating fins are separated from the mounting auxiliary plate, it is possible to achieve predetermined fixing strength.

In addition, in the power conditioner of the present disclosure, in plan view of the back surface of the heat dissipating member, at least one of the plurality of heat dissipating fins may include a projection in contact with the mounting auxiliary plate, and the mounting auxiliary plate may be fixed also to the projection.

In this configuration, it is possible to further firmly mount the power conditioner on the wall.

In addition, in the power conditioner disclosed herein, the projection is preferably integrally formed on the heat dissipating fin extending at substantially a center in plan view of the back surface of the heat dissipating member.

In this configuration, the mounting auxiliary plate and the heat dissipating member are fixed to each other at not only the edge but also the center in plan view of the power conditioner. Thus, it is possible to disperse a force applied to the mounting auxiliary plate due to the weight of the power conditioner, over the entirety of the mounting auxiliary plate. Accordingly, it is possible to further decrease the thickness of the mounting auxiliary plate while the mechanical strength is maintained.

In addition, the mounting auxiliary plate of the power conditioner disclosed herein preferably includes an uneven portion.

In this configuration, it is possible to increase airflow between the heat dissipating fins and the mounting auxiliary plate while the mechanical strength of fixing of the heat dissipating member and the mounting auxiliary plate is maintained. Thus, the heat dissipation efficiency further improves.

According to the present disclosure, a power conditioner is provided that can be assuredly and firmly mounted on the wall without decreasing the heat dissipation efficiency.

DETAILED DESCRIPTION OF EXEMPLARY EMBODIMENTS

Figure 1:
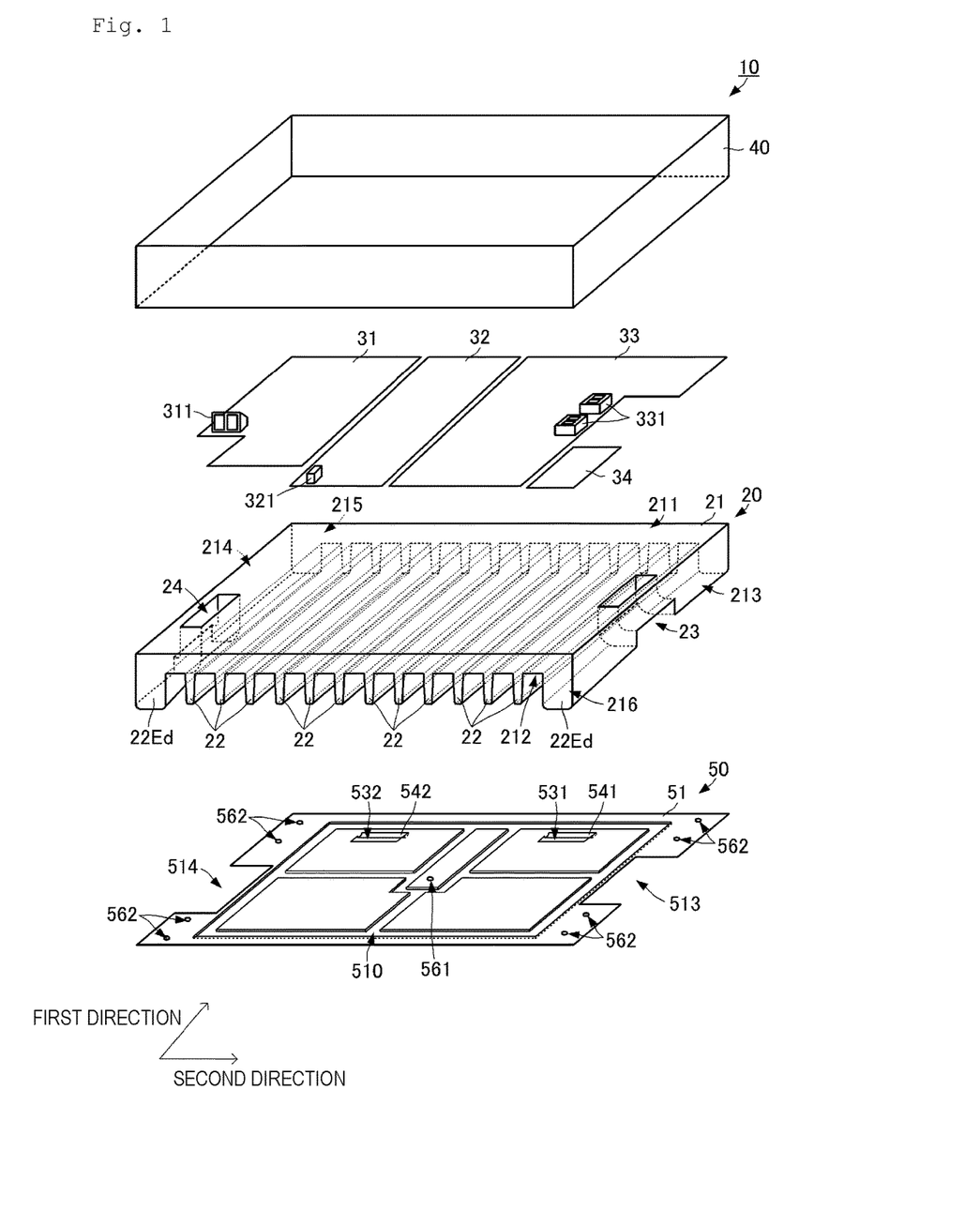
FIG. 1 is an exploded perspective view of a power conditioner according to an exemplary embodiment.
Figure 2A:
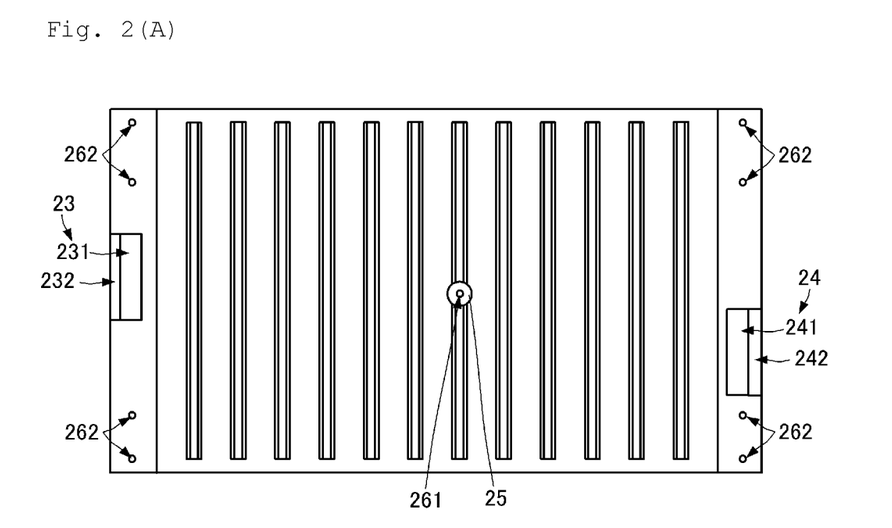
FIGS. 2(A) and 2(B) are plan views of a back surface of the power conditioner according to the exemplary embodiment.
Figure 2B:
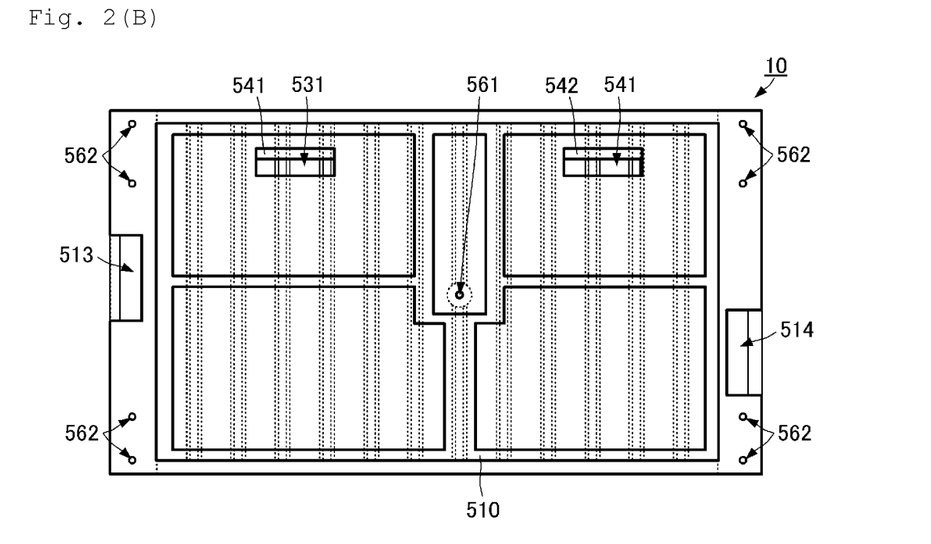
Figure 3A:
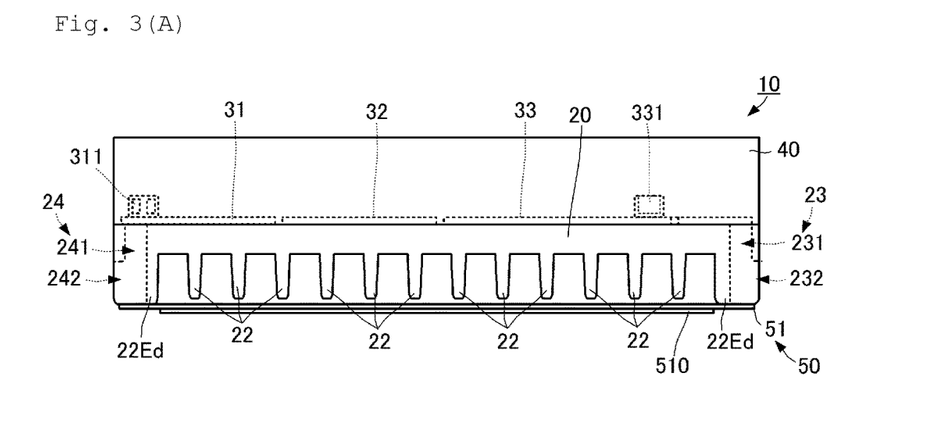
FIG. 3(A) is a top view in a state where the power conditioner according to the exemplary embodiment is to be installed on a wall.
Figure 3B:
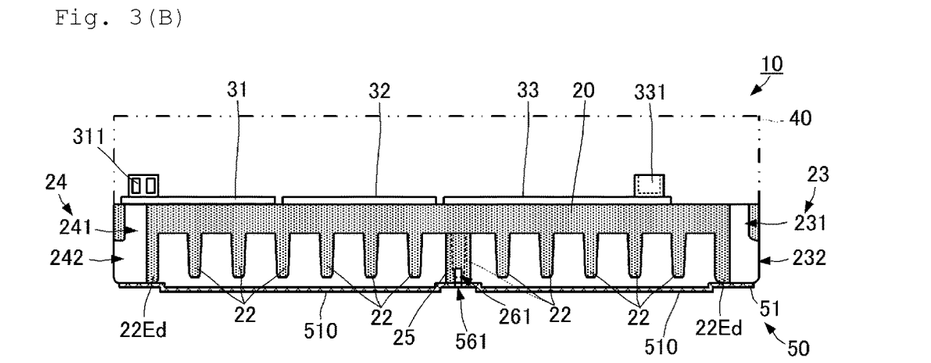
FIG. 3(B) is a configuration diagram of the power conditioner in top view.
Figure 4:
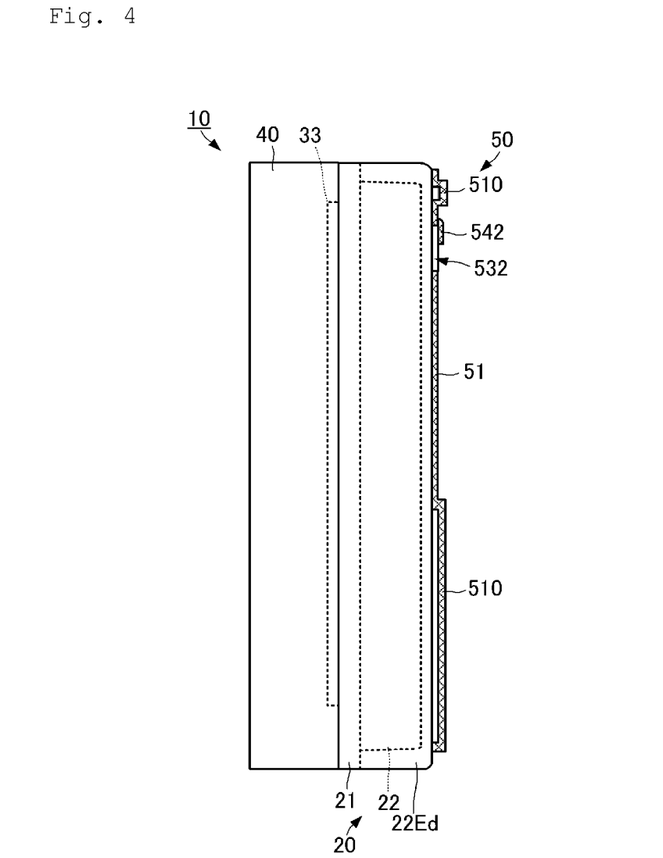
FIG. 4 is a side view in a state where the power conditioner according to the exemplary embodiment is to be installed on the wall.
Figure 5:
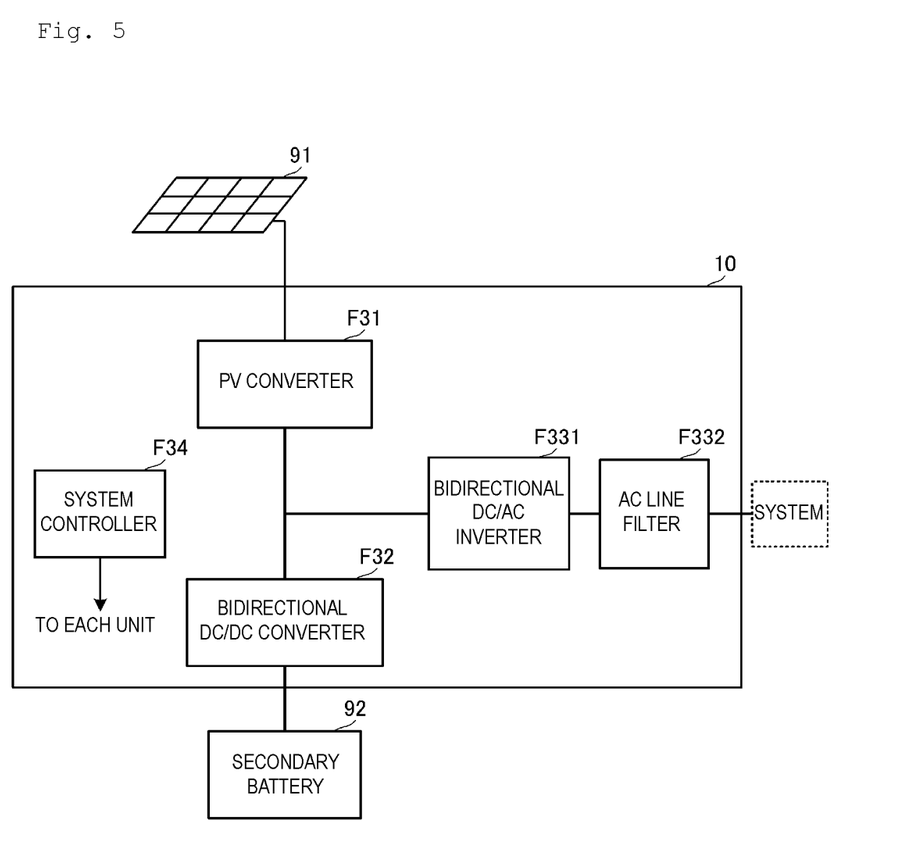
FIG. 5 is a functional block diagram of the power conditioner according to the exemplary embodiment.
Figure 6:
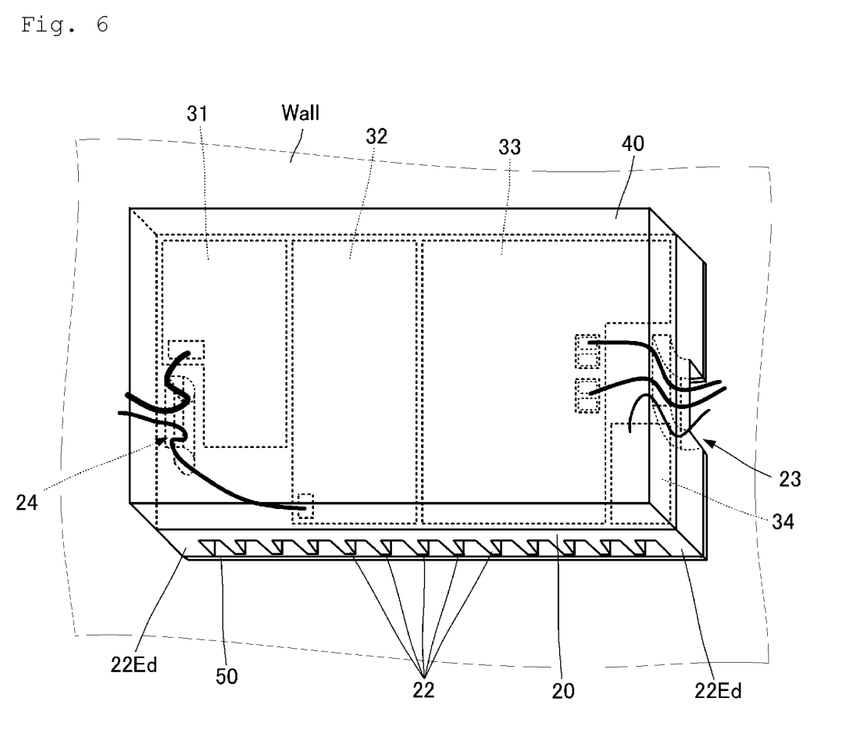
FIG. 6 is a perspective view showing a state where the power conditioner according to the exemplary embodiment is installed on the wall.
Figure 7:
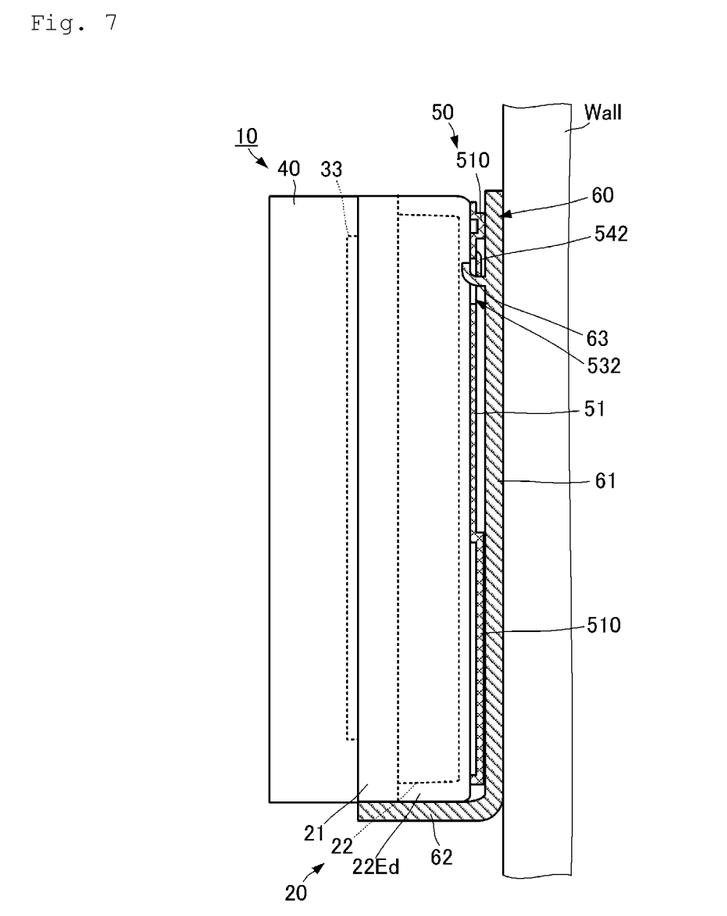
FIG. 7 is a side view in a state where the power conditioner according to the exemplary embodiment is installed on the wall.

A power conditioner according to an exemplary embodiment will be described with reference to the drawings. FIG. 1 is an exploded perspective view of the power conditioner according to the exemplary embodiment. FIG. 2 is plan views of a back surface of the power conditioner according to the exemplary embodiment. FIG. 2(A) shows a state where a mounting auxiliary plate is removed, and FIG. 2(B) shows a state where the mounting auxiliary plate is mounted. FIG. 3(A) is a top view in a state where the power conditioner according to the exemplary embodiment is to be installed on a wall, and FIG. 3(B) is a configuration diagram of the power conditioner in top view. FIG. 4 is a side view in a state where the power conditioner according to the exemplary embodiment is to be installed on the wall. FIG. 5 is a functional block diagram of the power conditioner according to the exemplary embodiment. FIG. 6 is a perspective view showing a state where the power conditioner according to the exemplary embodiment is installed on the wall. FIG. 7 is a side view in a state where the power conditioner according to the exemplary embodiment is installed on the wall. In FIGS. 1 to 4, 6, and 7, a cover of the power conditioner is omitted. In addition, in FIG. 6, thick lines indicate cables.

First, the configuration of the functional blocks of a power conditioner 10 according to the present embodiment will be described with reference to FIG. 5.

As shown, the power conditioner 10 includes a PV converter F31, a bidirectional DC/DC converter F32, a bidirectional DC/AC inverter F331, an AC line filter F332, and a system controller F34.

The PV converter F31, the bidirectional DC/DC converter F32, and the bidirectional DC/AC inverter F331 are connected to a HVDC (high voltage direct current) bus. The AC line filter F332 is connected between the bidirectional DC/AC inverter F331 and a commercial power system. The PV converter F31 is connected to a photovoltaic power generation panel 91. The bidirectional DC/DC converter F32 is connected to a secondary battery 92. A bidirectional DC/DC converter may be further included and connected to a fuel cell. In addition, the system controller F34 controls operation of the PV converter F31, the bidirectional DC/DC converter F32, and the bidirectional DC/AC inverter F331 while monitoring the voltage of the HVDC bus.

Each circuit function unit forming the power conditioner 10 includes a circuit element which generates heat due to current application or driving. Particularly, since a high current flows through the PV converter F31, the bidirectional DC/DC converter F32, the bidirectional DC/AC inverter F331, and the AC line filter F332, the amounts of heat generated in these circuit function units increase. Therefore, the power conditioner 10 needs a heat dissipating member 20 described later.

The power conditioner 10 having such a circuit configuration has a structure shown in FIGS. 1 to 4 according to the exemplary aspect.

As shown therein, the power conditioner 10 includes the heat dissipating member 20, circuit boards 31, 32, 33, and 34, a frame body 40, and a mounting auxiliary plate 50.

The heat dissipating member 20 includes a main plate 21, heat dissipating fins 22, and a pair of legs, shown as leg portions 22Ed. The main plate 21, the heat dissipating fins 22, and the leg portions 22Ed are integrally formed. In the exemplary embodiment, the heat dissipating member 20 is formed from a material having a high thermal conductivity. The use of the material having a high thermal conductivity enables effective heat dissipation. For example, the material of the heat dissipating member 20 is an alloy containing aluminum Al as a main component.

The main plate 21 is rectangular in plan view. The main plate 21 has a flat top surface 211. The main plate 21 has a bottom surface 212 on which a plurality of the heat dissipating fins 22 and the leg portions 22Ed are formed. The plurality of the heat dissipating fins 22 and the leg portions 22Ed have a long shape extending in a direction parallel to a first side surface 213 and a second side surface 214 of the main plate 21 which oppose each other (in a first direction of the present embodiment). The plurality of the heat dissipating fins 22 are arranged so as to be spaced apart from each other along a direction parallel to a third side surface 215 and a fourth side surface 216 of the main plate which are orthogonal to the top surface 211, the bottom surface 212, the first side surface 213, and the second side surface 214 and oppose each other (along a second direction of the present embodiment).

The pair of legs 22Ed (the terms "legs" and "leg portions" are used interchangeably) are disposed at both ends, respectively, in a direction in which the plurality of the heat dissipating fins 22 are arranged (in the second direction) and disposed therebetween. The height of each leg portion 22Ed (the length in a direction orthogonal to the main plate 21) is larger than the height of each heat dissipating fin 22 (the length in the direction orthogonal to the main plate 21). The side surfaces of the two leg portions 22Ed at the side opposite to the heat dissipating fins 22 are flush with the first side surface 213 and the second side surface 214, respectively. The width of each leg portion 22Ed is larger than the width of each heat dissipating fin 22. However, the width of each leg portion 22Ed only needs to be such a width as to allow the later-described mounting auxiliary plate 50 to be fixed, and is preferably as narrow as possible. By decreasing the width of each leg portion 22Ed, it is possible to widen the region where the heat dissipating fins 22 are disposed, so that it is possible to improve the heat dissipation efficiency.

The heat dissipating member 20 is provided with a first insertion hole 23 and a second insertion hole 24.

The first insertion hole 23 is provided within the region of the leg portion 22Ed at the first side surface 213 side in plan view. As shown in FIG. 2(A), for example, the first insertion hole 23 includes holes 231 and 232 connected to each other. The hole 231 is open on the top surface 211. The hole 232 is open on the first side surface 213. With this configuration, the first insertion hole 23 is a through hole that has one opening on the top surface 211 of the heat dissipating member 20, is bent at substantially a right angle in the middle thereof, and has another opening on the first side surface 213. Furthermore, the first insertion hole 23 is also open on the bottom surface 212.

The second insertion hole 24 is provided within the region of the leg portion 22Ed at the second side surface 214 side in plan view. As also shown in FIG. 2(A), the second insertion hole 24 includes holes 241 and 242 connected to each other. The hole 241 is open on the top surface 211. The hole 242 is open on the second side surface 214. With this configuration, the second insertion hole 24 is a through hole that has one opening on the top surface 211 of the heat dissipating member 20, is bent at substantially a right angle in the middle thereof, and has another opening on the second side surface 214. Furthermore, the second insertion hole 24 is also open on the bottom surface 212.

The first insertion hole 23 and the second insertion hole 24 are used as hand holds in installing the power conditioner 10 on a wall as shown in FIGS. 6 and 7. In addition, as shown in FIG. 7, the first insertion hole 23 and the second insertion hole 24 are used as holes for extending cables to be connected to the circuit boards 31, 32, 33, and 34, to the outside.

As shown in FIG. 3(B), for example, the heat dissipating member 20 is provided with a projection 25 at substantially the center in plan view of the heat dissipating member 20. The projection 25 has a columnar shape disposed so as to be seen as a circle in plan view. By forming the projection 25 as a column, the air resistance is decreased, so that it is possible to suppress a decrease in the heat dissipation efficiency due to the provision of the projection 25. The projection 25 is formed so as to be integrated with the heat dissipating fin 22 that extends through substantially the center in plan view of the heat dissipating member 20. The projection 25 has a screw fastening hole 261 described later, and is formed as small as possible within a range where mechanical strength sufficient for screw fastening is achieved. The projection 25 is formed with the same height (length in the direction orthogonal to the main plate 21) as that of each leg portion 22Ed.

The screw fastening holes 261 and 262 are formed in the heat dissipating member 20. The screw fastening hole 261 is provided in the projection 25. The screw fastening holes 262 is provided in each leg portion 22Ed at a plurality of locations. In this case, at least the screw fastening holes 262 is preferably provided near the respective corners of the heat dissipating member 20 in plan view.

The circuit boards 31, 32, 33, and 34 are mounted on the top surface 211 of the main plate 21 of the heat dissipating member 20. A connector 311 and the circuit element forming the PV converter F31 are mounted on the circuit board 31. A connector 321 and the circuit element forming the bidirectional DC/DC converter F32 are mounted on the circuit board 32. A connector 331 and the circuit elements forming the bidirectional DC/AC inverter F331 and the AC line filter F332 are mounted on the circuit board 33. The circuit element forming the system controller F34 is mounted on the circuit board 34.

The circuit boards 31, 32, 33, and 34 generate heat due to driving or current application. The heat is transmitted to the heat dissipating member 20, and most of the heat is dissipated by the heat dissipating fins 22 during operation.

The frame body 40 is provided at the top surface 211 side of the heat dissipating member 20. Although not shown, a plurality of slits for heat dissipation are provided in the frame body 40. Heat is also dissipated from the slits for heat dissipation to some extent. The frame body 40 is disposed along the first, second, third, and fourth side surfaces 213, 214, 215, and 216 of the heat dissipating member 20. That is, the frame body 40 is disposed such that the circuit boards 31, 32, 33, and 34 are included within the frame body 40. The opening of the frame body 40 at the side opposite to the heat dissipating member 20 is covered with a cover which is not shown. In this case, an insulating protection sheet is preferably disposed at the inner side of the cover. Preferably, in terms of operability and safety, the protection sheet has low translucency and has a shape in which only the connectors are exposed.

In the exemplary embodiment, the mounting auxiliary plate 50 includes a main plate 51 having a substantially rectangular outer shape. The shape of the main plate 51 in plan view is substantially the same as the shape of the heat dissipating member 20 in plan view. The main plate 51 is formed from a material having high rigidity such as steel. The rigidity of the main plate 51 is preferably higher than the rigidity of the heat dissipating member 20. However, it is possible to decrease the thickness of the main plate 51 as the rigidity increases.

The main plate 51 is provided with cuts 513 and 514. The cut 513 is located at a position at which the cut 513 overlaps the first insertion hole 23 in a state where the mounting auxiliary plate 50 is fixed to the back surface of the heat dissipating member 20. The cut 514 is located at a position at which the cut 514 overlaps the second insertion hole 24 in a state where the mounting auxiliary plate 50 is fixed to the back surface of the heat dissipating member 20.

Through holes 531 and 532 are formed in the main plate 51. The through holes 531 and 532 are located with an interval therebetween along the second direction in the main plate 51. The through holes 531 and 532 are located with a center position in the second direction in the main plate 51 therebetween. The through holes 531 and 532 each have a predetermined height (length in the first direction) and a predetermined width (length in the second direction). According to the exemplary embodiments, the heights and the widths of the through holes 531 and 532 are preferably determined on the basis of: the shape of hook members 63 (see FIG. 7) for mounting which are attached to the wall; and mechanical strength required for the mounting auxiliary plate 50.

An eave 541 is formed at the edge of the through hole 531 so as to partially cover the through hole 531, and an eave 542 is formed at the edge of the through hole 541 so as to partially cover the through hole 541. By providing these eaves 541 and 542, it is possible to improve the fixing strength to the hook members 63 and the stability of a fixed state. In addition, by providing these eaves 541 and 542, it is possible to easily hook the power conditioner 10 on the hook members 63.

The main plate 51 is further provided with an uneven portion 510 formed by drawing. The uneven portion 510 is formed in a predetermined shape by considering airflow between the heat dissipating member 20 and the mounting auxiliary plate 50.

Screw fastening holes 561 and 562 are formed in the main plate 51. The screw fastening holes 561 and 562 are formed in a region of the main plate 51 where there is no uneven portion 510. The screw fastening hole 561 is located at substantially the center of the main plate 51 in plan view. The screw fastening holes 562 are located near both end sides of the main plate 51 in the second direction.

The mounting auxiliary plate 50 is fixed to the back surface side of the heat dissipating member 20 by the uneven portion 510 such that the projecting side is the side opposite to the heat dissipating member 20. In this case, the screw fastening hole 561 of the mounting auxiliary plate 50 and the screw fastening hole 261 of the heat dissipating member 20 overlap each other, and the screw fastening holes 562 of the mounting auxiliary plate 50 and the screw fastening holes 262 of the heat dissipating member 20 are aligned with each other. A screw is screwed into the screw fastening hole 561 and the screw fastening hole 261 of the heat dissipating member 20. Screws are screwed into the screw fastening holes 562 and the screw fastening holes 262 of the heat dissipating member 20. As a result, the mounting auxiliary plate 50 can be firmly fixed to the back surface of the heat dissipating member 20.

According to an exemplary embodiment, a power conditioner 10 as described herein can be mounted and fixed to the wall (identified as "Wall") as shown in FIGS. 6 and 7.

A wall-side jig 60 is installed on the wall surface of the wall. The wall-side jig 60 includes a main body 61, a receiving plate 62, and the hook members 63. The wall-side jig 60 is formed from a material having high rigidity. The main body 61, the receiving plate 62, and the hook members 63 are integrally formed. The main body 61 is brought into contact with and fixed to the wall surface. The receiving plate 62 is a flat plate extending in a direction orthogonal to a flat plate surface of the main body 61. A plurality of air holes which are not shown are formed in the receiving plate 62. The plurality of air holes overlap the spaces between the heat dissipating fins 22 in a state where the power conditioner 10 is installed. Each hook member 63 has a shape projecting form the flat plate surface of the main body 61 and extending while being curved.

The power conditioner 10 is fixed to the wall-side jig 60, that is, the wall by fitting the through holes 531 and 532 of the mounting auxiliary plate 50 to the hook members 63.

In this case, the power conditioner 10 is supported such that the fourth side surface 216 side of the heat dissipating member 20 is in contact with the receiving plate 62. Therefore, the power conditioner 10 is stably fixed to the wall. In this case, since the plurality of air holes of the receiving plate 62 overlap the spaces between the heat dissipating fins 22 of the power conditioner 10, airflow is not blocked, so that it is possible to increase the heat dissipation effect.

With such a configuration, it is possible to fix the power conditioner 10 to the wall even when a through hole for mounting to the wall is not provided in the heat dissipating member 20. In this case, since the rigidity of the mounting auxiliary plate 50 is higher than the rigidity of the heat dissipating member 20, it is possible to decrease the thickness of the member surrounding each through hole. Therefore, even when a through hole is provided in the mounting auxiliary plate 50 in a smaller region or with a smaller thickness than a through hole is provided in the heat dissipating member 20, it is possible to achieve desired fixing strength to the wall. Therefore, the power conditioner 10 can have a thin design when compared with convention power conditioners.

In addition, since the height of each leg portion 22Ed of the heat dissipating member 20 is larger than the height of each heat dissipating fin 22, the heat dissipating fins 22 do not come into contact with the mounting auxiliary plate 50. Thus, it is possible to prevent heat from being transmitted from the heat dissipating fins 22 directly to the mounting auxiliary plate 50. Therefore, it is possible to reduce damage to the wall surface due to use of the power conditioner 10 over a long period of time.

In this case, since the mounting auxiliary plate 50 is fixed to each leg portion 22Ed of the heat dissipating member 20 at a plurality of locations, it is possible to achieve required fixing strength even when the heat dissipating fins 22 are separated from the mounting auxiliary plate 50.

Moreover, with the above-described configuration, the heat dissipating member 20 and the mounting auxiliary plate 50 are fixed to each other also at substantially the center in plan view of the heat dissipating member 20 and the mounting auxiliary plate 50. Thus, it is possible to dispersedly receive a load, which is applied to the mounting auxiliary plate 50 by the power conditioner 10 due to the fixing, on the entire surface of the mounting auxiliary plate 50. Thus, it is possible to further improve the mechanical strength in a state where the power conditioner 10 is fixed to the wall via the mounting auxiliary plate 50. Therefore, it is possible to make the mounting auxiliary plate 50 thin, and it is possible to make the overall size of the power conditioner 10 thinner. In this case, the positions at which the mounting auxiliary plate 50 and the heat dissipating member 20 are fixed to each other are preferably are symmetrical about a straight line located at the center in the second direction and extending in the first direction in plan view of the power conditioner 10.

Furthermore, with the above-described configuration, the uneven portion 510 is provided to the mounting auxiliary plate 50 by drawing, and the mounting auxiliary plate 50 is fixed to the heat dissipating member 20 at a plurality of positions different from the uneven portion 510. Thus, it is possible to improve airflow between the heat dissipating fins 22 and the mounting auxiliary plate 50. Therefore, it is possible to further improve the heat dissipation efficiency.

REFERENCE SIGNS LIST 10, 10P power conditioner
20 heat dissipating member
21 main plate
22 heat dissipating fin
22Ed leg portion
23 first insertion hole
24 second insertion hole
29P projection
31, 32, 33, 34 circuit board
40 frame body
50 mounting auxiliary plate
51 main plate
60 wall-side jig
61 main body
62 receiving plate
63 hook member
91 photovoltaic power generation panel
92 secondary battery
211 top surface
212 bottom surface
213 first side surface
214 second side surface
215 third side surface
216 fourth side surface
261, 262 screw fastening hole
290P hook-shaped hole
311, 321, 331 connector
510 uneven portion
513, 514 cut
531, 532 through hole
541, 542 eave
F31 PV converter
F32 bidirectional DC/DC converter
F331 bidirectional DC/AC inverter
F332 AC line filter
F34 system controller

The invention claimed is:

1. A power conditioner comprising:
a circuit board;
a heat dissipating member having a front surface on which the circuit board is configured to be mounted and a back surface opposing the front surface and having a plurality of heat dissipating fins extending therefrom; and
a mounting auxiliary plate configured to be fixed to the heat dissipating member on a side opposite of which the circuit board is mounted,
wherein the plurality of heat dissipating fins each have a shape extending in a first direction in plan view of the heat dissipating member on a side on which the mounting auxiliary plate can be mounted, with at least one of the plurality of heat dissipating fins including a projection that contacts the mounting auxiliary plate when the mounting auxiliary plate is mounted to the heat dissipating member,
wherein the plurality of heat dissipating fins are spaced apart from each other in a second direction orthogonal to the first direction,
wherein at least one hole extends through the mounting auxiliary plate and is configured for receiving a fixing member for mounting the power conditioner to a wall, and
wherein the mounting auxiliary plate has a higher rigidity than a rigidity of the heat dissipating member.

2. The power conditioner according to claim 1, wherein the circuit board includes a power conditioner circuit having an electric heat generating element.

3. The power conditioner according to claim 1, wherein the heat dissipating member includes a pair of legs extending in the first direction parallel to the plurality of heat dissipating fins with the plurality of heat dissipating fins disposed between the pair of legs.

4. The power conditioner according to claim 3, wherein the mounting auxiliary plate is fixed to each of the pair of legs at a plurality of locations along each leg.

5. The power conditioner according to claim 4, wherein a void is present between the heat dissipating fins and the mounting auxiliary plate when the mounting auxiliary plate is fixed to the heat dissipating member.

6. The power conditioner according to claim 3, wherein the pair of legs each comprise a height in a direction orthogonal to the back surface of the heat dissipating member that is greater than a height of the plurality of heat dissipating fins extending in the direction orthogonal to the back surface of the heat dissipating member.

7. The power conditioner according to claim 6, wherein the pair of legs creates a void between the heat dissipating fins and the mounting auxiliary plate when the mounting auxiliary plate is fixed to the heat dissipating member.

8. The power conditioner according to claim 1, wherein the mounting auxiliary plate is fixed to the projection when the mounting auxiliary plate is fixed to the heat dissipating member.

9. The power conditioner according to claim 1, wherein the projection is integrally formed on the respective heat dissipating fin that extends at substantially a center in plan view of the side of the heat dissipating member on which the mounting auxiliary plate is fixed.

10. The power conditioner according to claim 1, wherein the mounting auxiliary plate includes an uneven portion.

11. The power conditioner according to claim 10, wherein the mounting auxiliary plate is fixed to the heat dissipating member at a plurality of positions other than the uneven portion, such that the uneven portion facilitates airflow between the plurality of heat dissipating fins and the mounting auxiliary plate.

12. The power conditioner according to claim 1, wherein the mounting auxiliary plate is configured to be fixed to the heat dissipating member, such that the mounting auxiliary plate dispersedly receives a load applied when the power conditioner is mounted to the wall.

13. The power conditioner according to claim 1, wherein the mounting auxiliary plate is configured to be fixed to the heat dissipating member, such that the mounting auxiliary plate is fixed to the heat dissipating member symmetrically about a straight line located at a center in a direction perpendicular to a length of the plurality of heat dissipating fins.

14. A power conditioner comprising:
a circuit board including an electric heat generating element;
a heat dissipating member including a first surface mountable to the circuit board and a second surface that is opposite to the first surface, the heat dissipating member including a pair of legs extending from the second surface with a plurality of fins disposed between the pair of legs to dissipate heat from the electric heat generating element during operation of the power conditioner; and a mounting auxiliary plate fixable to the pair of legs of the heat dissipating member to define a void between the plurality of fins and the mounting auxiliary plate when the mounting auxiliary plate is fixed to the pair of legs of the heat dissipating member, wherein at least one hole extends through the mounting auxiliary plate and is configured for receiving a fixing member for mounting the power conditioner to a wall, and wherein the plurality of fins each have a shape extending in lengthwise direction in a plan view of the heat dissipating member on which the mounting auxiliary plate can be mounted, with at least one of the plurality of heat dissipating fins including a projection that contacts the mounting auxiliary plate when the mounting auxiliary plate is fixed to the heat dissipating member.

15. The power conditioner according to claim 14, wherein the mounting auxiliary plate has higher rigidity than the heat dissipating member.

16. The power conditioner according to claim 14, wherein the mounting auxiliary plate includes an uneven portion and the mounting auxiliary plate is fixable to the heat dissipating member at a plurality of positions other than the uneven portion, such that the uneven portion facilitates airflow between the plurality of fins and the mounting auxiliary plate.

17. The power conditioner according to claim 14, wherein the plurality of fins are spaced apart from each other in a widthwise direction orthogonal to the lengthwise direction, and wherein the pair of legs of the heat dissipating member extend in the lengthwise direction parallel to the plurality of fins.

\* \* \* \* \*